US008531882B2

(12) United States Patent
Fujimura et al.

(10) Patent No.: US 8,531,882 B2
(45) Date of Patent: Sep. 10, 2013

(54) SEMICONDUCTOR MEMORY DEVICE INCLUDING A PLURALITY OF STACKED SEMICONDUCTOR MEMORY CHIPS

(75) Inventors: Tomofumi Fujimura, Fujisawa (JP); Yuui Shimizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 184 days.

(21) Appl. No.: 13/159,696

(22) Filed: Jun. 14, 2011

(65) Prior Publication Data
US 2011/0305086 A1 Dec. 15, 2011

(30) Foreign Application Priority Data

Jun. 15, 2010 (JP) ................................. 2010-135950

(51) Int. Cl.
*G11C 16/06* (2006.01)

(52) U.S. Cl.
USPC ................. 365/185.09; 365/185.11; 365/200; 365/201; 365/230.03

(58) Field of Classification Search
USPC ........... 365/185.09, 185.11, 200, 201, 230.03
See application file for complete search history.

(56) References Cited

U.S. PATENT DOCUMENTS

| 6,115,828 | A  | * | 9/2000  | Tsutsumi et al. | ............ | 714/6.32 |
| 7,123,527 | B2 | * | 10/2006 | Kuzuno et al. | ................ | 365/200 |
| 7,791,919 | B2 |   | 9/2010  | Shimizu |   |   |
| 8,050,121 | B2 | * | 11/2011 | Yagishita | ....................... | 365/200 |
| 2003/0107918 | A1 | * | 6/2003 | Koyama et al. | .......... | 365/185.09 |
| 2008/0074930 | A1 |   | 3/2008 | Kanda |   |   |

FOREIGN PATENT DOCUMENTS

JP 2008-77779 4/2008

* cited by examiner

*Primary Examiner* — Connie Yoha
(74) *Attorney, Agent, or Firm* — Oblon, Spivak, McClelland, Maier & Neustadt, L.L.P.

(57) ABSTRACT

A memory includes stacking chips. The chip includes a pad commonly connected to the chips and receiving an enable signal that enables access to each chip. The chip includes a chip address memory that can store a chip address. The chip includes a determining part comparing a select address to the chip address for determining whether they match each other. The chip includes a control-signal setting part setting the control signal inputted to the chip itself to be valid or invalid depending on a determination made by the determining part. The chip includes a chip-address setting part determining whether the chip address is stored in the chip address memory depending on number of fail bits. The device includes a memory controller allocating respectively different ones of the chip addresses to the chips based on the number of fail bits.

16 Claims, 7 Drawing Sheets

SEMICONDUCTOR MEMORY DEVICE INCLUDING A PLURALITY OF STACKED SEMICONDUCTOR MEMORY CHIPS

CROSS REFERENCE TO RELATED APPLICATIONS

This application is based upon and claims the benefit of priority from the prior Japanese Patent Application No. 2010-135950, filed on Jun. 15, 2010, the entire contents of which are incorporated herein by reference.

FIELD

The embodiments of the present invention relate to a semiconductor memory device.

BACKGROUND

In recent years, as semiconductor memory devices have a large capacity, semiconductor memory devices have begun to be utilized as secondary memory devices alternative to hard disks. For example, a NAND EEPROM constituted by NAND cells in which memory cells are cascade-connected is suitable for high integration and thus widely used for secondary memory devices and memory cards of mobile terminals such as mobile phones.

In such a semiconductor memory device, TSV (Through-Silicon Via) has been known. According to a TSV structure, a plurality of memory chips are stacked within a package and a through-hole via is provided so as to penetrate from a bottom layer chip to a top layer chip of the stacked memory chips, so that pads of all memory chips are commonly wired. Alternatively, there is a structure that a wiring is provided in a sidewall from the bottom layer chip to the top layer chip of the stacked memory chips, so that pads of all memory chips are commonly wired.

In a stacked multi-chip package, a plurality of stacked chips need to have specific chip addresses so that the respective chips are distinguished from each other and operated individually. When the chips are connected to each other by bonding, pads for chip address are provided on the respective chips and different leads are bonded to pads for identifying a chip address on the chips, so that these chips can be distinguished from each other.

Because pads at the same position are commonly connected in the TSV structure and the structure that a common wiring is provided in side surfaces of chips, chips cannot be distinguished from each other by bonding. In this respect, there is an idea that a chip address is stored in advance in a memory of each chip before the chip is stacked. However, stacking a plurality of chips in view of chip addresses is inefficient and the chips need to be sorted at the time of assembling, and there is a problem of cost increase.

DETAILED DESCRIPTION

A semiconductor memory device according to an embodiment of the present invention is constituted by stacking a plurality of semiconductor memory chips. The semiconductor memory chip comprises a pad commonly connected to the semiconductor memory chips and configured to receive an enable signal that enables access to each of the semiconductor memory chips. The semiconductor memory chip comprises a memory cell array configured to have a plurality of memory cells. The semiconductor memory chip comprises a chip address memory that can store a chip address indicating an address of the semiconductor chip itself. The semiconductor memory chip comprises a determining part configured to compare a select address externally inputted through the pad to the chip address for determining whether they match each other. The semiconductor memory chip comprises a control-signal setting part configured to set the control signal inputted to the semiconductor chip itself to be valid or invalid depending on a determination made by the determining part. The semiconductor memory chip comprises a chip-address setting part configured to determine whether the chip address is stored in the chip address memory depending on number of fail bits related to the memory cells. The semiconductor memory device comprises a memory controller configured to allocate respectively different ones of the chip addresses to the semiconductor memory chips based on the number of fail bits.

Embodiments will now be explained with reference to the accompanying drawings. The present invention is not limited to the embodiments.

First Embodiment

Figure 1:
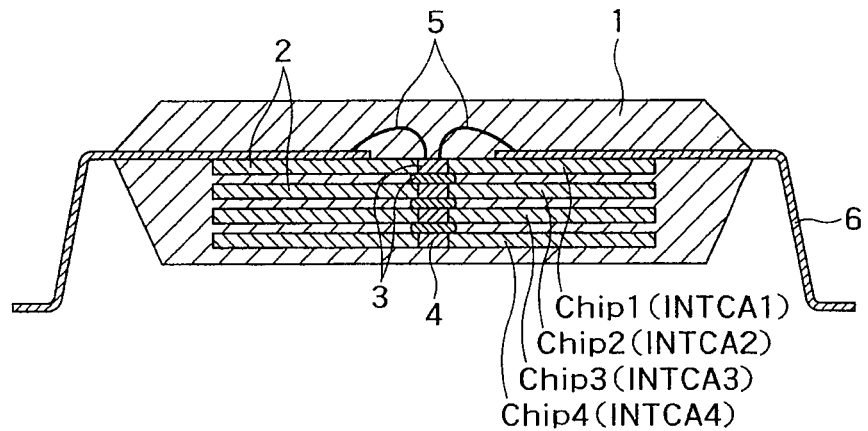
FIG. 1 is a cross-sectional view showing a configuration of a NAND flash memory according to a first embodiment.
Figure 2:
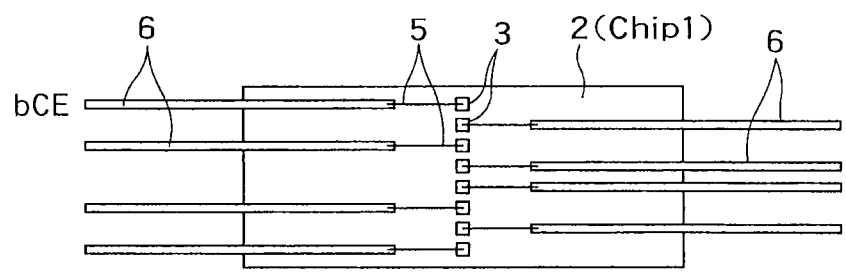
FIG. 2 is a plan view of the memory shown in FIG. 1.

FIG. 1 is a cross-sectional view showing a configuration of a NAND flash memory (hereinafter, also "memory") according to a first embodiment. FIG. 2 is a plan view of the memory shown in FIG. 1. This memory is constituted by a package 1 that seals a plurality of stacked memory chips 2 with a resin. The stacked memory chips 2 are defined as Chip1, Chip2, Chip3, and Chip4 in order from the top. A pad 3 that receives signals from outside of each of the memory chips Chip1 to Chip4 or externally outputs signals is provided on a surface of each of the memory chips Chip1 to Chip4. The pads 3 are commonly connected to each other by a plurality of through-hole vias 4 that penetrate vertically from a bottom layer of the memory chip 2 to a top layer thereof. That is, the first embodiment includes a through-silicon electrode (TSV (through-silicon via)). The number of stacked memory chips is not limited to four and can be equal to or smaller than three or equal to or larger than five.

As shown in FIG. 2, each of the pads 3 formed on the top layer Chip1 is connected through a wiring 5 to an input/output pin 6 provided so as to externally protrude from an inside of the package 1. The pad 3 of Chip1 thus inputs/outputs signals from/to outside via the input/output pin 6. The pad 3 of the memory chip Chip1 is electrically connected via the through-hole via 4 to the pads 3 of the memory chips Chip2 to Chip4. Accordingly, all the memory chips Chip1 to Chip4 can input/output signals from/to outside via the through-hole via 4 and the input/output pin 6.

Further, a NAND controller 100 that controls the whole memory chips Chip1 to Chip4 is incorporated in the package 1. The NAND controller 100 is placed in the bottom layer or an intermediate layer of FIG. 1 as a separate chip. The NAND controller 100 is configured to control signal transmissions between the memory chips Chip1 to Chip4 and outside.

Figure 3:
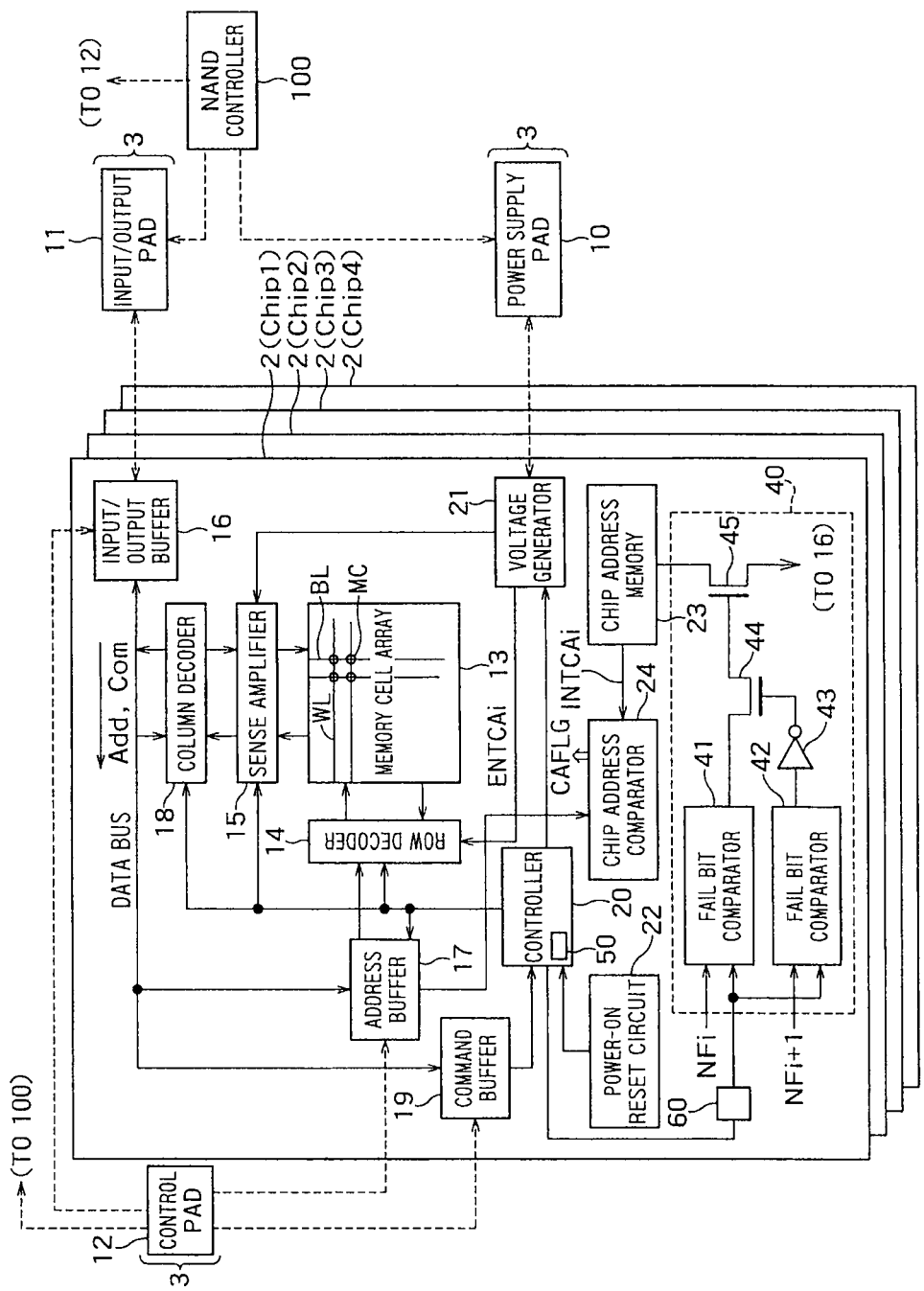
FIG. 3 is a block diagram showing a configuration of each of the stacked memory chips 2.

FIG. 3 is a block diagram showing a configuration of each of the stacked memory chips 2. The pad 3 includes a power supply pad 10 that receives a supply voltage, an input/output pad 11 that inputs/outputs data signals, and a control pad 12 that receives control signals from outside of the memory chip (the NAND controller 100). Signals inputted to the respective pads are different from each other depending on an intended use. The memory chip 2 includes, in addition to these pads 3, a memory cell array 13, a row decoder 14, a sense amplifier 15, an input/output buffer 16, an address buffer 17, a column decoder 18, a command buffer 19, a controller 20, a voltage generator 21, a power-on reset circuit 22, a chip address memory 23, a chip address comparator 24, a chip-address setting unit 40, a fail bit counter 50, and a fail bit memory 60.

The memory cell array 13 includes a plurality of memory cells MC two-dimensionally arranged in a matrix. The memory cells MC are serially connected to each other to constitute a NAND string. A plurality of bit lines BL electrically connect between an end of the NAND string and the sense amplifier 15. A plurality of word lines WL electrically connect between gates of the memory cell MC and the row decoder 14. Each of the memory cells MC is provided at an intersection of the bit line BL and the word line WL. The row decoder 14 includes a word line driver and a select gate-line driver to selectively drive a word line WL and a select gate line according to a row address. The sense amplifier 15 is connected to the bit line BL and detects data from the memory cells MC.

Data is exchanged between an internal of the memory chip 2 and the input/output pad 11 through the input/output buffer 16, a data bus, the address buffer 17, and the command buffer 19. Data received from the input/output pad 11 is fetched in the sense amplifier 15. An address Add received through the input/output pad 11 is transferred through the input/output buffer 16, the data bus, and the address buffer 17 to the row decoder 14 and the column decoder 18. A command Com received through the input/output pad 11 is transferred through the input/output buffer 16, the data bus, and the command buffer 19 to the controller 20.

The controller 20 controls data write, read, and erasure based on the inputted command Com. The voltage generator 21 is controlled by the controller 20 to generate various internal voltages required for the write, the read, and the erasure. The voltage generator 21 includes a booster to generate an internal voltage higher than the supply voltage supplied from the power supply pad 10. The power-on reset circuit 22 detects application of power to the memory chip 2 to make the controller 20 perform an initialization operation. The chip address memory 23 stores own chip addresses INTCAi different for the memory chips Chip1 to Chip4. It suffices that the chip address memory 23 is an electrically writable memory device, and thus the chip address memory 23 is not particularly limited. For example, the chip address memory 23 can be a ROM, a RAM, or a fuse. The chip address comparator 24 compares the own chip address INTCAi received from the chip address memory 23 to a selected chip address EXTCAi inputted from the address buffer 17. The chip address comparator 24 outputs an address flag signal CAFLG as a result of comparison of the own chip address INTCAi to the selected chip address EXTCAi, as a determination signal indicating whether they match each other.

Because normal operations for the data write, read, and erasure can be known ones, detailed explanations thereof will be omitted.

The fail bit counter 50 is incorporated in the controller 20 and counts the number of defective memory cells (the number of fail bits) in the memory cell array 13. The number of defective memory cells is determined by writing predetermined data in all the memory cells MC in the memory cell array 13 and then reading (verify-reading) this data, and comparing data written by the controller 20 to the read data. The number of defective memory cells is stored in the fail bit memory 60. The number of defective memory cells is usually different for the memory chips Chip1 to Chip4. In the first embodiment, the number of defective memory cells (the number of fail bits) is thus utilized as a parameter for determining a chip address. The fail bit memory 60 can be provided in the controller 20 or the chip-address setting unit 40.

The chip-address setting unit 40 is configured to determine whether a chip address is stored in the chip address memory 23 depending on the number of defective memory cells serving as a parameter. The chip-address setting unit 40 thus includes fail bit comparators 41 and 42, an inverter 43, and switching transistors 44 and 45. An operation of the chip-address setting unit 40 enables the NAND controller 100 serving as a memory controller to allocate different chip addresses to the memory chips Chip1 to Chip4 based on the number of defective memory cells.

The fail bit comparator 41 receives the number of defective memory cells NFA from the fail bit memory 60 and externally receives a first reference value NFi (i is an integer) through the input/output pad 11. The fail bit comparator 41 then compares the actual number of defective memory cells NFA to the first reference value NFi and outputs its result. For example, when the actual number of defective memory cells NFA is smaller than the first reference value NFi, the fail bit comparator 41 outputs logic low. When the actual number of defective memory cells NFA is equal to or larger than the first reference value NFi, the fail bit comparator 41 outputs logic high.

The fail bit comparator 42 receives the number of defective memory cells NFA from the fail bit memory 60 and externally receives a second reference value NFi+1 through the input/output pad 11. The fail bit comparator 42 then compares the actual number of defective memory cells NFA to the second reference value NFi+1 and outputs its result. For example, when the actual number of defective memory cells NFA is smaller than the second reference value NFi+1, the fail bit comparator 42 outputs logic low. When the actual number of defective memory cells NFA is equal to or larger than the second reference value NFi+1, the fail bit comparator 42 outputs logic high.

The fail bit comparators 41 and 42 can be integrally constituted or can be provided separately.

The first reference value NFi and the second reference value VNFi+1 are different integers and data externally provided through the input/output pad 11 and the input/output buffer 16. According to the first embodiment, NFi+1 is larger than NFi. When the actual number of defective memory cells NFA is between the first reference value NFi and the second reference value VNFi+1, the chip-address setting unit 40 connects between the chip address memory 23 and the input/ output buffer 16. Specifically, an output of the fail bit comparator 41 is connected to a gate of the switching transistor 45 through the switching transistor 44. An output of the fail bit comparator 42 is connected to a gate of the switching transistor 44 through the inverter 43.

The switching transistor 44 connects the output of the fail bit comparator 41 to the gate of the switching transistor 45 or disconnects the output of the fail bit comparator 41 from the gate of the switching transistor 45, depending on an inverted signal of the output of the fail bit comparator 42.

When the switching transistor 44 connects the output of the fail bit comparator 41 to the gate of the switching transistor 45, the switching transistor 45 connects the chip address memory 23 to the input/output buffer 16, depending on the output of the fail bit comparator 41. That is, the switching transistor 45 serves to transmit a chip address from the NAND controller 100 to the chip address memory 23. At this time, the chip address memory 23 can externally receive a chip address through the input/output pad 11 and the input/output buffer 16. In this way, when the output of the fail bit comparator 41 is logic high and the output of the fail bit comparator 42 is logic low (when NFA is equal to or larger than NFi and less than NFi+1), the chip address memory 23 externally receives a chip address through the input/output pad 11 and the input/output buffer 16.

The chip-address setting unit 40 determines whether a chip address is stored in the chip address memory 23, depending on the number of defective memory cells NFA. When the chip-address setting unit 40 determines that the chip address is stored in the chip address memory 23 (that is, when the switching transistor 45 is switched on), the chip address is stored in the chip address memory 23 and the chip address of the corresponding memory chip is determined.

Assume that the respective numbers of defective memory cells of the memory chips Chip1 to Chip4 are NFA1 to NFA4, respectively. The first reference value NFi and the second reference value NFi+1 are provided to distinguish the memory chips Chip1 to Chip4 from each other using the numbers of defective memory cells NFA1 to NFA4.

For example, assume that the number of defective memory cells NFA1 is between a first reference value NF3 and a second reference value NF4, the number of defective memory cells NFA2 is between a first reference value NF1 and a second reference value NF2, the number of defective memory cells NFA3 is between a first reference value NF0 and a second reference value NF1, and the number of defective memory cells NFA4 is between a first reference value NF3 and a second reference value NF4. When the respective chip-address setting units 40 for the memory chips Chip1 to Chip4 receive the first reference value NF0 and the second reference value NF1 under such a condition, only the switching transistor 45 of the memory chip Chip3 is switched on and other switching transistors 45 of the memory chips Chip1, Chip2, and Chip4 maintain a switched-off state. Only the chip address memory 23 of the memory chip Chip3 becomes accessible from outside (the NAND controller 100) and a chip address is stored only in the chip address memory 23 of the memory chip Chip3 from outside. As a result, the chip address of the memory chip Chip3 can be determined.

Similarly, when the respective chip-address setting units of the memory chips Chip1 to Chip4 receive the first reference value NF1 and the second reference value NF2, only the chip address memory 23 of the memory chip Chip2 becomes an externally accessible state and a chip address is stored only in the chip address memory 23 of the memory chip Chip2 from outside. As a result, the chip address of the memory chip Chip2 can be determined. When the respective chip-address setting units 40 of the memory chips Chip1 to Chip4 receive the first reference value NF2 and the second reference value NF3, only the chip address memory 23 of the memory chip Chip1 becomes an externally accessible state and a chip address is stored only in the chip address memory 23 of the memory chip Chip1 from outside. As a result, the chip address of the memory chip Chip1 can be determined. Further, when the respective chip-address setting units 40 of the memory chips Chip1 to Chip4 receive the first reference value NF3 and the second reference value NF4, only the chip address memory 23 of the memory chip Chip1 becomes an externally accessible state and a chip address is stored only in the chip address memory 23 of the memory chip Chip1 from outside. As a result, the chip address of the memory chip Chip1 can be determined.

As described above, by successively changing the first reference value NFi and the second reference value NFi+1 inputted to the memory chips Chip1 to Chip4, an externally accessible memory chip can be changed.

However, the number of defective memory cells NFA of a single memory chip is not always between the first reference value NFi and the second reference value NFi+1. The numbers of defective memory cells NFA for a plurality of memory chips are sometimes between the first reference value NFi and the second reference value NFi+1. That is, a plurality of memory chips may be in a same group.

In this case, when the first reference value NFi and the second reference value NFi+1 are inputted to all of the stacked memory chips Chip1 to Chip4, the chip address memories 23 of a plurality of memory chips become accessible. It is necessary that the NAND controller 100 does not store chip addresses in any of the memory chips. This is because, when a same chip address is stored in the memory chips, these memory chips cannot be distinguished from each other.

Normally, when the chip address memories 23 of a plurality of memory chips are accessible, a load of a wiring from the NAND controller 100 to the chip address memory 23 becomes larger by the number of accessible chip addresses and a voltage drop becomes large accordingly, as compared to a case that the chip address memory 23 of one memory chip is accessible. The NAND controller 100 detects this voltage drop of the wiring so as to recognize that the chip address memories 23 of a plurality of memory chips are accessible.

When the chip address memories 23 of a plurality of memory chips are accessible, the NAND controller 100 does not send chip addresses to the memory chips. With this configuration, a same chip address can be prevented from being applied to the memory chips.

Further, when the number of defective memory cells NFA between the first reference value NFi and the second reference value NFi+1 does not exist, the voltage drop of the wiring from the NAND controller 100 to the chip address memory 23 is extremely small or substantially none. Also in this case, the NAND controller 100 does not need to send chip addresses to the memory chips.

Meanwhile, when a specific chip address is applied to a memory chip, the NAND controller 100 prohibits access to that memory chip so that the chip address of that memory chip is not changed in a subsequent chip-address setting operation. Prohibiting of access can be achieved by inactivating a chip enable signal bCE shown in FIG. 4.

For a plurality of memory chips to which chip addresses are not applied yet, the NAND controller 100 changes a verify-read condition (a page to be verify-read or a word line voltage at the time of verify-read) and then performs the chip-address setting operation explained above again. By changing the verify-read condition, the numbers of defective memory cells NFA of the memory chips can be different from each other. Accordingly, by repeating the chip-address setting operation while a write condition or the verify-read condition is changed, the NAND controller 100 can apply specific chip addresses to the memory chips Chip1 to Chip4. Because the memory chips Chip1 to Chip4 have different specific chip addresses INTCA1 to 4, any of the memory chips Chip1 to Chip4 can be identified by select addresses EXTCA1 to EXTCA4 inputted from the input/output pin 6.

With this arrangement, the stacked memory can make an identified memory chip accessible and perform a normal operation such as write, read, or erasure only on the identified memory chip.

Figure 4:
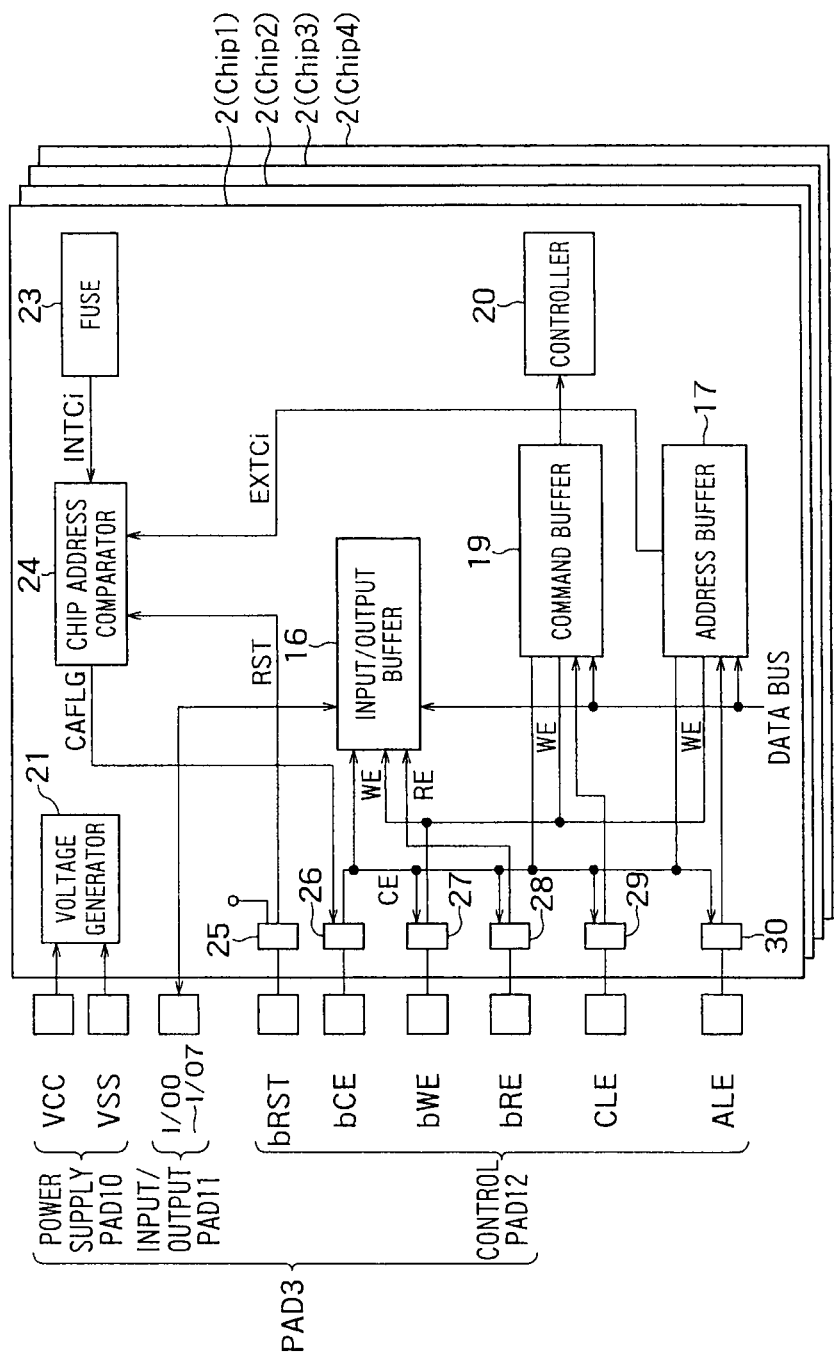
FIG. 4 is a block diagram showing a detailed configuration of the pad 3 and a detailed connection relationship between the pad 3 and an internal circuit of each memory chip 2.

FIG. 4 is a block diagram showing a detailed configuration of the pad 3 and a detailed connection relationship between the pad 3 and an internal circuit of each memory chip 2. A supply voltage VCC and a ground voltage VSS are inputted to two power supply pads 10, respectively and a voltage required for, for example, the voltage generator 21 is supplied. "b" described in the following explanations denotes an inverted signal of a signal "".

For example, 8-bit data I/O0 to I/O7 are inputted to the input/output pad 11. These pieces of the data I/O0 to I/O7 are connected to the input/output buffer 16.

For example, the control pad 12 is constituted by six pads 3 and different control signals are inputted to the respective pads 3. As an example, assume that a reset signal bRST that reset the memory chip 2 in a selectable state (a state that selection is made and access can be made) or an unselectable state (a state that selection is not made and access cannot be made) to be in the selectable state, a chip enable signal bCE that sets the memory chip 2 to be accessible, a write enable signal bWE that writes data in the memory chip 2, a read enable signal bRE that serially outputs the data in the memory chip 2, a command-latch enable signal CLE that enables the data I/O0 to I/O7 to be fetched as a command, and an address-latch enable signal ALE that enables the data I/O0 to I/O7 to be fetched as an address are inputted to the six control pads, respectively.

These signals inputted to the control pad 12 are outputted to an RST buffer 25, a CE buffer 26, a WE buffer 27, an RE buffer 28, a CLE buffer 29, and an ALE buffer 30, respectively. The buffers 25 to 30 are activated or inactivated depending on a signal inputted to a buffer input terminal INBUFen. That is, the buffers 25 to 30 function as a control-signal setting unit that sets an inputted control signal to be valid or invalid based on the signal of the buffer input terminal INBUFen.

At least one of the control pads 12 that receives the chip enable signal bCE is commonly connected through TSVs to the memory chips Chip1 to Chip4. When the memory is seen from above as in FIG. 2, pads commonly connected to the memory chips Chip1 to Chip4 are arranged in the respective memory chips Chip1 to Chip4 so as to overlap with each other in a stacked state of the memory chips.

Figure 5:
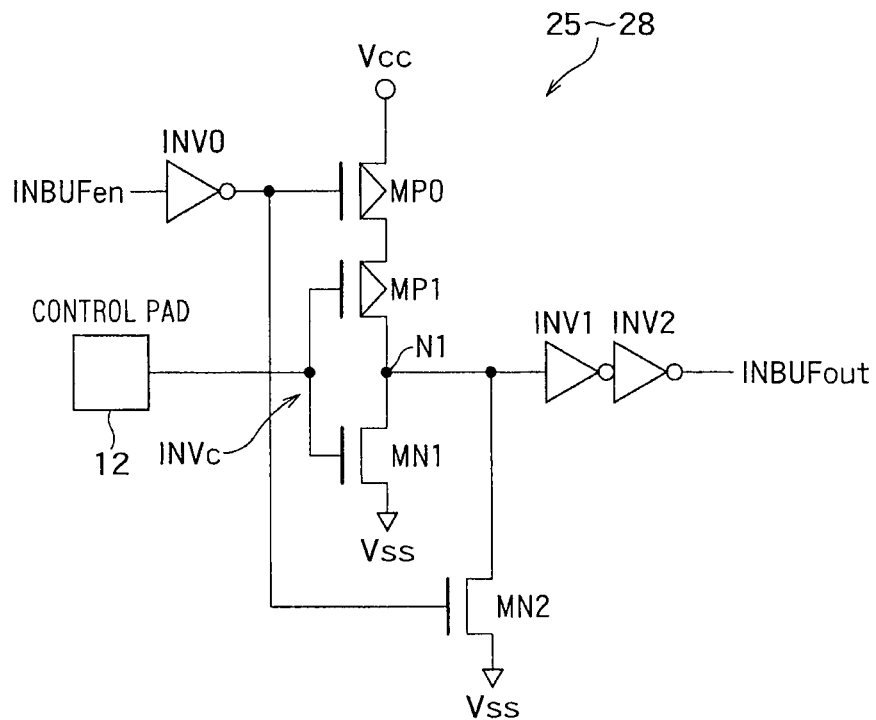
FIG. 5 shows a specific configuration example of the RST buffer 25, the CE buffer 26, the WE buffer 27, and the RE buffer 28.
Figure 6:
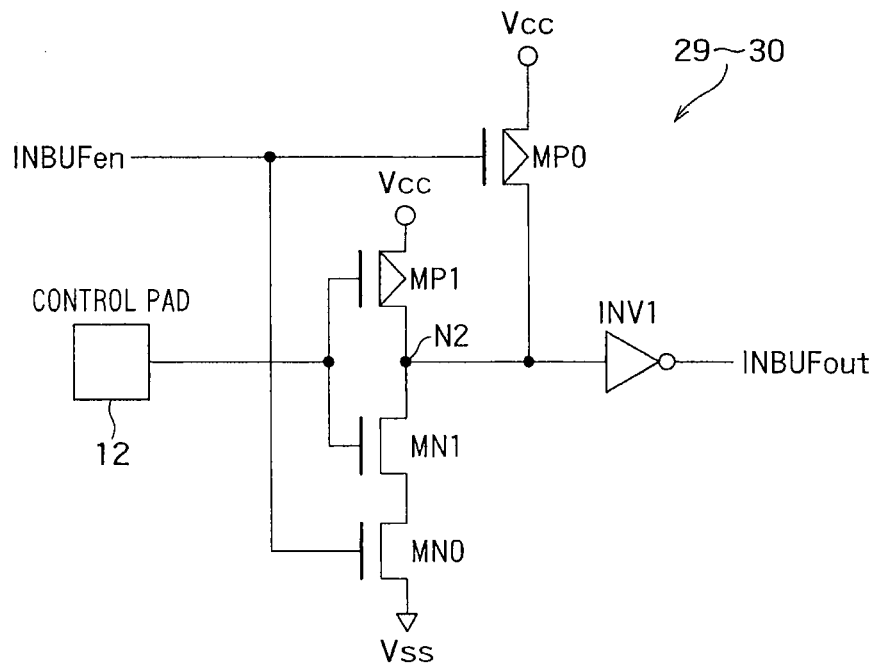
FIG. 6 shows a specific configuration example of the CLE buffer 29 and the ALE buffer 30.

FIG. 5 shows a specific configuration example of the RST buffer 25, the CE buffer 26, the WE buffer 27, and the RE buffer 28. FIG. 6 shows a specific configuration example of the CLE buffer 29 and the ALE buffer 30.

As shown in FIG. 5, the buffers 25 to 28 can be constituted by, for example, P-MOS transistors MP0 and MP1 and N-MOS transistors MN1 and MN2. A source of the P-MOS transistor MP0 is connected to the supply voltage VCC and its gate is connected through an inverter INV0 to the buffer input terminal INBUFen. A signal inputted to the buffer input terminal INBUFen is set to be always "H" in the RST buffer 25. The address flag signal CAFLG is inputted in the CE buffer 26. In the WE buffer 27 and the RE buffer 28, the chip enable signal bCE outputted from the CE buffer 26 is inputted as explained later. A source of the P-MOS transistor MP1 is connected to a drain of the P-MOS transistor MP0 and control signals from the control pads 12 (the reset signal bRST, the chip enable signal bCE, the write enable signal WE, and the read enable signal RE) are inputted to its gate. A drain node N1 of the N-MOS transistor MN1 is connected to a drain of the P-MOS transistor MP1, its source is connected to the ground voltage VSS, and the control signals from the respective control pads 12 are inputted to its gate. When the control signal is "H", an output of the node N1 is "L". When the control signal is "L", the output of the node N1 is "H". That is, the transistors MP1 and MN1 constitute a MOS inverter INVc. A drain output of the N-MOS transistor MN1 is connected through inverters INV1 and INV2 to a buffer output terminal INBUFout. A signal outputted from the buffer output terminal INBUFout is a reset signal RST in the RST buffer 25, the chip enable signal bCE in the CE buffer 26, a write enable signal WE in the WE buffer 27, and a read enable signal RE in the RE buffer 28. A source of the N-MOS transistor MN2 is connected to the ground voltage VSS and an inverted signal of the signal inputted to the buffer input terminal INBUFen (bINBUFen) is inputted through the inverter INV0 to its gate. Because the buffers 25 to 28 have such a configuration, when the signal inputted to the buffer input terminal INBUFen is "H", the control signals inputted from the respective control pads 12 can be set to be valid and when the signal inputted to the buffer input terminal INBUFen is "L", the control signals inputted from the respective control pads 12 can be set to be invalid.

Further, as shown in FIG. 6, the buffers 29 and 30 include, for example, the P-MOS transistor MP0 whose source is connected to the supply voltage VCC, whose drain is connected to a node N2, and whose gate is connected to the buffer input terminal INBUFen, the P-MOS transistor MP1 whose source is connected to the supply voltage VCC, whose drain is connected to the node N2, and whose gate receives the control signal from the control pad 12 (ALE or CLE), the N-MOS transistor MN1 whose source is connected through an N-MOS transistor MN0 to the ground power supply VSS, whose drain is connected to the node N2, and whose gate receives the control signal from the control pad 12 (ALE or CLE), and the N-MOS transistor MN0 whose source is connected to the ground power supply VSS, whose drain is connected to the source of the N-MOS transistor MN1 and whose gate is connected to the buffer input terminal INBUFen. The P-MOS transistors MP1 and the N-MOS transistor MN1 constitute an inverter INVd. The node N2 serving as the output of the inverter INVd is connected through an inverter INV1 to the buffer output terminal INBUFout.

As explained above, the buffers 29 and 30 can set the control signals ALE and CLE inputted to the respective control pads 12 to be valid when the signal inputted to the buffer input terminal INBUFen is "H (High)" and to be invalid when the signal inputted to the buffer input terminal INBUFen is "L (Low)". Power or signals can be inputted to these pads 3 from the NAND controller 100.

Figure 7:
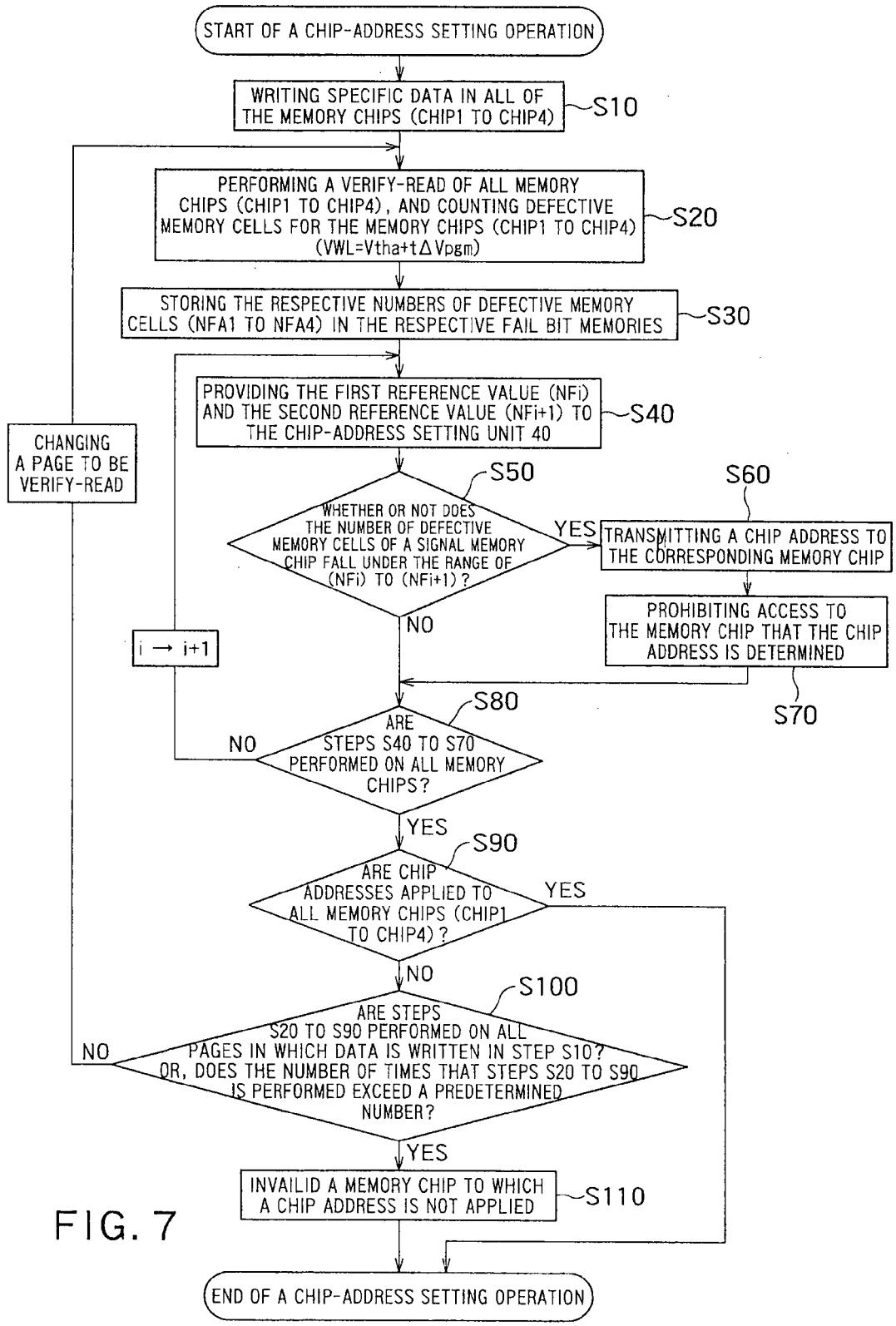
FIG. 7 is a flowchart showing a chip-address setting operation using a memory according to the first embodiment in further detail.

FIG. 7 is a flowchart showing a chip-address setting operation using a memory according to the first embodiment in further detail. The NAND controller 100 writes specific data in all of the memory chips Chip1 to Chip4 (S10). At this time, the memory chips Chip1 to Chip4 are not distinguished from each other by chip addresses. The write operation in step S10 is for an operation of researching the number of defective memory cells NFA and setting a chip address (a chip-address setting operation). Accordingly, it is not always necessary that the write operation of step S10 is the same as that in a normal operation. For example, data can be written in some pages serving as a part of each of the memory chips Chip1 to Chip4 or in all pages of each of the memory chips Chip1 to Chip4. When data is written in some pages serving as a part of each of the memory chips Chip1 to Chip4, the data needs to be written in pages of the respective memory chips with a same address. For example, the data to be written can have a same logic value or can be data according to a given pattern. Further, the voltage level of the word line WL or the bit line BL at the time of write can be different from that of a write operation in the normal operation. For example, a word line voltage Vtha at the time of write in step S10 can be about 90% of a word line voltage at the time of write in the normal operation. The consumption power in the chip-address setting operation can thus be reduced.

Further, the write operation of step S10 can be performed before the memory chips Chip1 to Chip4 are stacked or after the memory chips Chip1 to Chip4 are stacked. When step S10 is performed before the memory chips are stacked, the memory chips Chip1 to Chip4 are stacked after step S10. When step S10 is performed after the memory chips are stacked, the chip-address setting operation continues after step S10.

The NAND controller 100 then verify-reads all memory chips Chip1 to Chip4. While the verify-read is performed, the fail bit counter 50 shown in FIG. 3 counts defective memory cells (S20). Data read by this verify-read does not need to be all of the data written in the memory chips Chip1 to Chip4 in step S10 and can be a part thereof. For example, the data read by the verify-read can be data of one specific page of each of the memory chips Chip1 to Chip4. A voltage applied to a select word line at the time of verify-read is somewhat lower than the word line voltage Vtha at the time of write in step S10. For example, a voltage VWL applied to a select word line at the time of verify-read can be Vtha−t*ΔVpgm, where t is a positive number. ΔVpgm denotes a step-up width of a select word line voltage stepped up in each write loop of a write stage in a normal operation.

Because the memory chips Chip1 to Chip4 are not distinguished from each other at this time, pages read in step S20 have a same address (a page address) in the respective memory chips Chip1 to Chip4.

After the verify-read, the memory chips Chip1 to Chip4 store the respective numbers of defective memory cells NFA1 to NFA4 counted by the respective fail bit counters 50 in the respective fail bit memories 60 (S30).

The NAND controller 100 provides the first reference value NFi and the second reference value NFi+1 to the chip-address setting unit 40 (S40). As explained above, when the actual number of defective memory cells NFA is in the range of NFi to NFi+1, the switching transistor 45 of the corresponding memory chip (see FIG. 3) is switched on.

When the number of defective memory cells NFA of a single memory chip is in the range of NFi to NFi+1 (YES in step S50), the NAND controller 100 transmits a chip address to the corresponding memory chip (S60). The memory chip that receives the chip address stores this chip address in the chip address memory 23 (see FIG. 3). Further, access to the memory chip that the chip address is determined is prohibited (S70). Prohibiting of access is performed by inactivating the chip enable signal bCE shown in FIG. 4, for example.

Meanwhile, when the respective numbers of defective memory cells NFA of a plurality of memory chips are in the range of NFi to NFi+1 or when any of the respective numbers of defective memory cells NFA of the memory chips is not in the range of NFi to NFi+1 (NO in step S50), the NAND controller 100 does not transmit chip addresses to the corresponding memory chips. Whether only one memory chip has NFA in the range of NFi to NFi+1 can be determined by, as explained above, detecting the voltage drop of the wiring from the NAND controller 100 to the chip address memory 23.

An operation of steps S40 to S70 is performed on all first reference values NFi and all second reference values NFi+1. For example, the NAND controller 100 includes a counter for counting i and increases i such as 0, 1, 2 . . . . At this time, a plurality of memory chips are classified depending on the number of defective memory cells NFA by the operation of steps S40 to S70, that is, classified into a memory chip that the number of defective memory cells NFA is in the range of NF0 to NF1, a memory chip that the number of defective memory cells NFA is in the range of NF1 to NF2, and a memory chip that the number of defective memory cells NFA is in the range of NF2 to NF3. The reference values NF1, NF2, NF3, NF4 . . . can be numerical values set so as to have fixed intervals therebetween, such as 0, 10, 20, 30 . . . . The maximum value of NFi+1 is equal to the number of bits of a page in a memory chip.

When steps S40 to S70 are not performed on all "i"s (NO in S80), the NAND controller 100 changes "I" to "i+1" and performs steps S40 to S70 again.

Meanwhile, when steps S40 to S70 are performed on all "i"s (YES in S80), the NAND controller 100 then determines whether chip addresses are applied to all memory chips Chip1 to Chip4 (S90). When the numbers of defective memory cells NFA of a plurality of memory chips are included in the range of NFi to NFi+1, a memory chip to which a chip address is not applied exists. Specifically, the NAND controller 100 compares the number of stacked memory chips to the number of applied chip addresses. When these numbers are different from each other, it is determined that a memory chip to which a chip address is not applied exists (NO in step S90). In this case, a page to be verify-read (a measurement position) is changed and steps S20 to S90 are performed again. At this time, because access to the memory chip to which a chip address is applied is prohibited, steps S20 to S90 are performed only on a memory chip to which a chip address is not applied yet. Because the page to be verify-read is changed, the number of defective memory cells NFA of each memory chip may be different from the one in steps S20 to S90 for the first time. Accordingly, a memory chip to which a chip address is not applied in step S20 to S90 for the first time can receive a chip address by steps S20 to S90 for the second time.

It is needless to mention that the respective numbers of defective memory cells NFA of a plurality of memory chips may be in the same range of NFi to NFi+1 even though a page is changed. However, by repeating changes in page and steps S20 to S90, memory chips to which a chip address is not applied are reduced.

When a memory chip to which a chip address is not applied exists even though steps S20 to S90 are performed on all pages that write is performed in step S10 or when a memory chip to which a chip address is not applied exists even though the number of times that steps S20 to S90 is performed exceeds a predetermined number (YES in S100), that memory chip can be invalid (cannot be used) as a defective chip (S110). Access to the defective chip is prohibited in a normal operation and the defective chip is handled as the one that does not exist in a memory.

When some of all pages that write is performed in step S10 remain or when the number of times that steps S20 to S90 is performed does not exceed the predetermined number (NO in S100), a page to be verify-read is changed and then steps S20 to S90 are performed as explained above.

The chip-address setting operation is performed in this manner. After chip addresses are set, chip addresses specific to the respective memory chips Chip1 to Chip4 are stored in the respective chip address memories 23 of the memory chips Chip1 to Chip4. The NAND controller 100 can store the chip addresses specific to the memory chips Chip1 to Chip4 in a memory (not shown) within the NAND controller 100.

In the normal operation after the setting operation, the NAND controller 100 can identify any of the memory chips Chip1 to Chip4 by the chip address and operate the identified memory chip.

As explained above, according to the first embodiment, after a plurality of memory chips are stacked, a chip address can be applied to each of the memory chips. Accordingly, the memory chips Chip1 to Chip4 do not need to be distinguished from each other before they are stacked and thus all memory chips can be handled equally. Consequently, a plurality of memory chips do not need to be stacked in order by considering chip addresses of the memory chips. This simplifies assembling memories and the time required for assembling can be reduced. Because chip addresses do not need to be handled in a wafer manufacturing process, wafers can be easily manufactured.

Further, because all memory chips and all wafers do not need to be distinguished from each other before they are stacked, a plurality of wafers are stacked and thereafter dicing can be performed on them. Stacked memory chips can thus be formed at the same time with dicing. That is, wafers are stacked before dicing, TSVs are formed, and then dicing can be performed on them. By carrying out the first embodiment thereafter, chip addresses can be applied to stacked chips. Assembling memories thus becomes easier and the time required for assembling is reduced.

Second Embodiment

Figure 8:
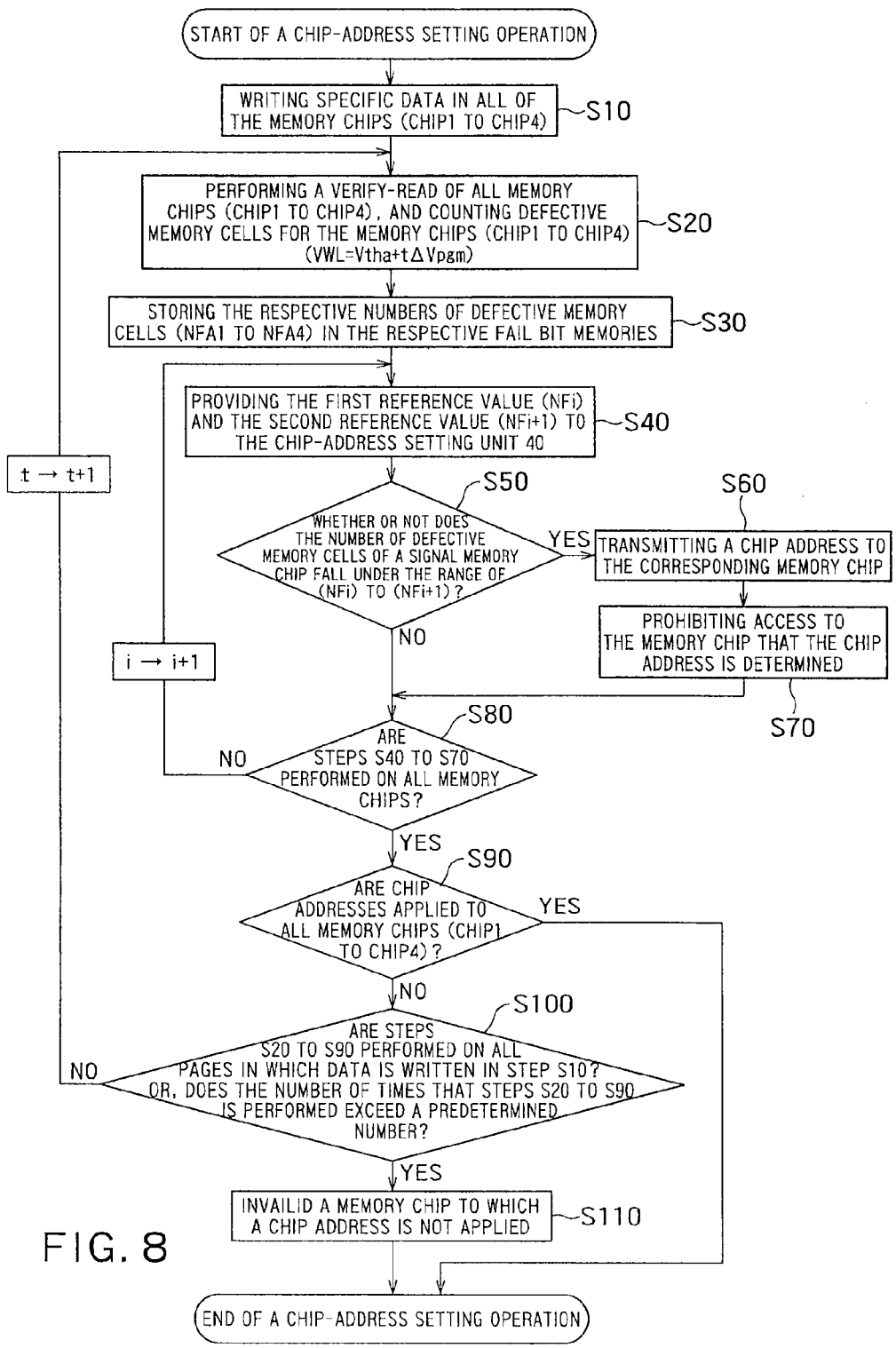
FIG. 8 is a flowchart showing a chip-address setting operation using a memory according to a second embodiment.

FIG. 8 is a flowchart showing a chip-address setting operation using a memory according to a second embodiment of the present invention in further detail. According to the second embodiment, when step S90 is NO, the voltage VWL of a select word line at the time of verify-read is decreased as a condition for measuring parameters. Other operations of the second embodiment are identical to corresponding ones of the first embodiment. In addition, the memory configuration of the second embodiment can be identical to the memory configuration of the first embodiment.

According to the second embodiment, when step S90 is NO, a memory does not change a page to be verify-read but reduces the voltage VWL of a select word line at the time of verify-read as the condition for measuring parameters. For example, "t" in the voltage VWL of a select word line (VWL=Vtha−t*$\Delta$Vpgm) is changed to t+1. The voltage VWL of a select word line is thus reduced by $\Delta$Vpgm. By reducing the voltage VWL of a select word line, the number of defective memory cells NFA of each memory chip can be different from the one in steps S20 to S90 for the first time. A chip address can thus be applied to a memory chip to which a chip address is not applied in steps S20 to S90 for the first time by steps S20 to S90 for the next time.

It is needless to mention that the numbers of defective memory cells NFA of a plurality of memory chips are sometimes in the same range of NFi to NFi+1 even though the voltage VWL of a select word line is reduced. By repeating changes in voltage VWL and steps S20 to S90, however, memory chips to which a chip address is not applied are reduced. When a memory chip to which a chip address is not applied exists even though steps S20 to S90 are performed on all pages where write is performed in step S10 or when a memory chip to which a chip address is not applied exists even though the number of times that steps S20 to S90 are performed exceeds a predetermined number (YES in S100), that memory chip can be invalid (cannot be used) as a defective chip (S110). When some of all pages that write is performed in step S10 remain or when the number of times that steps S20 to S90 are performed does not exceed the predetermined number (NO in S100), as explained above, a page to be verify-read is changed and then steps S20 to S90 are performed.

Also in the case that the chip-address setting operation is performed while the voltage VWL of a select word line is changed as in the second embodiment, chip addresses can be applied to the memory chips Chip1 to Chip4. Therefore, the second embodiment can achieve effects identical to those of the first embodiment.

Third Embodiment

Figure 9:
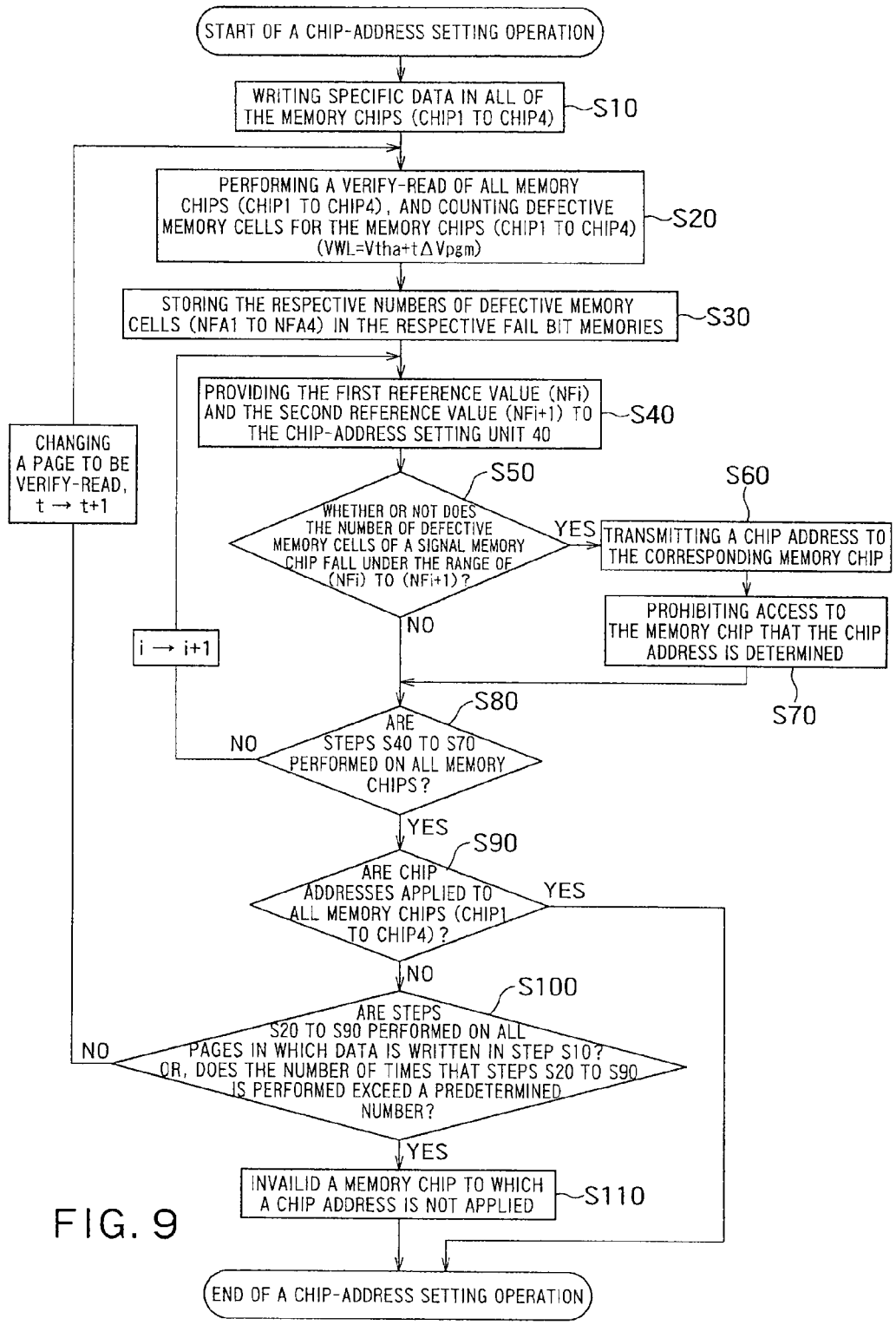
FIG. 9 is a flowchart showing a chip-address setting operation using a memory according to a third embodiment.

FIG. 9 is a flowchart showing a chip-address setting operation using a memory according to a third embodiment of the present invention in further detail. According to the third embodiment, when step S90 is NO, a page to be verify-read is changed as the parameter measurement position and the voltage VWL of a select word line at the time of verify-read is decreased as the condition for measuring parameters. That is, the third embodiment is a combination of the first and second embodiments. Other operations of the third embodiment are identical to corresponding ones of the first embodiment. In addition, the memory configuration of the third embodiment can be identical to the memory configuration of the first embodiment.

According to the third embodiment, when step S90 is NO, a memory changes a page to be verify-read and the voltage VWL of a select word line. The number of defective memory cells NFA of each memory chip can thus be different from the one in steps S20 to S90 for the first time. A chip address can thus be applied to a memory chip to which a chip address is not applied in steps S20 to S90 for the first time by steps S20 to S90 for the next time.

It is needless to mention that the numbers of defective memory cells NFA of a plurality of memory chips are sometimes in the same range of NFi to NFi+1 even though the voltage VWL of a select word line is canged. When steps S20 to S90 are repeated while a page to be verify-read and the voltage VWL are changed, no memory chip to which a chip address is not applied exists. When a memory chip to which a chip address is not applied exists even though steps S20 to S90 are performed on all pages that write is performed in step S10 or when a memory chip to which a chip address is not applied exists even though steps S20 to S90 are performed for a predetermined times, that memory chip can be invalid (cannot be used) as a defective chip (S110).

When some of all pages that write is performed in step S10 remain or when the number of times that steps S20 to S90 are performed does not exceed the predetermined times (NO in S100), the page to be verify-read is changed and then steps S20 to S90 are performed, as explained above.

Because both the page to be verify-read and the voltage VWL of a select word line are changed in the third embodiment, the numbers of defective memory cells NFA of the memory chips probably vary greatly. According to the third embodiment, the number of times that steps S20 to S90 are repeated can thus be reduced. That is, chip addresses can be applied earlier to the memory chips Chip1 to Chip4 according to the third embodiment. The time required for the chip-address setting operation can thus be reduced. In addition, the third embodiment can achieve effects identical to those of the first embodiment.

While the switching transistors 44 and 45 are constituted by an N-MIS transistor in FIG. 3, the switching transistors 44 and 45 can be constituted by a P-MIS transistor. When the switching transistors 44 and 45 are P-MIS transistors, it suffices that the logic of signals outputted from the fail bit comparators 41 and 42 is inverted.

Further, VWL may be Vtha+t*ΔVpgm, instead of Vtha−t*ΔVpgm. Other arbitrary measurable parameters can be also used for applying operations of the chip address.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device comprising a plurality of semiconductor memory chips stacked, each of the semiconductor memory chips comprising:
   a pad commonly connected to the semiconductor memory chips and configured to receive an enable signal that enables access to each of the semiconductor memory chips;
   a memory cell array comprising a plurality of memory cells;
   a chip address memory configured to store a chip address indicating an address of the semiconductor memory chip itself;
   a determining part configured to compare a select address externally inputted through the pad to the chip address in order to determine whether or not they match each other;
   a control-signal setting part configured to set the control signal inputted to the semiconductor memory chip itself to be valid or invalid, depending on a determination made by the determining part; and
   a chip-address setting part configured to determine whether the chip address is stored in the chip address memory or not, depending on number of fail bits in a specified area of the semiconductor memory chip itself, wherein
   the semiconductor memory device comprises a memory controller configured to allocate respectively different ones of the chip addresses to the semiconductor memory chips, depending on the number of fail bits.

2. The device of claim 1, wherein
   each of the semiconductor memory chips further comprises:
   a fail bit counter configured to count number of fail bits in the memory cell array; and
   a fail bit memory configured to store the number of fail bits of the semiconductor memory chip itself, wherein
   the chip-address setting part determines whether the chip address is to be stored in the chip address memory or not, depending on the number of fail bits, and
   the memory controller allocates respectively different ones of chip addresses to the semiconductor memory chips, depending on the number of fail bits.

3. The device of claim 1, wherein when the stacked semiconductor memory chips are viewed from above, the pads are arranged in the semiconductor memory chips so as to overlap with each other.

4. The device of claim 2, wherein when the stacked semiconductor memory chips are viewed from above, the pads are arranged in the semiconductor memory chips so as to overlap with each other.

5. The device of claim 1, wherein
   the chip-address setting part comprises:
   a comparator configured to compare first and second reference values received from outside of the semiconductor memory chip to the number of fail bits; and
   a switching transistor configured to transmit the chip address from the memory controller to the chip address memory, when the number of fail bits of the semiconductor memory chip itself is between the first reference value and the second reference value.

6. The device of claim 2, wherein
   the chip-address setting part comprises:
   a comparator configured to compare first and second reference values received from outside of the semiconductor memory chip to the number of fail bits; and
   a switching transistor configured to transmit the chip address from the memory controller to the chip address memory, when the number of fail bits of the semiconductor memory chip itself is between the first reference value and the second reference value.

7. The device of claim 3, wherein
   the chip-address setting part comprises:
   a comparator configured to compare first and second reference values received from outside of the semiconductor memory chip to the number of fail bits; and
   a switching transistor configured to transmit the chip address from the memory controller to the chip address memory, when the number of fail bits of the semiconductor memory chip itself is between the first reference value and the second reference value.

8. The device of claim 5, wherein the memory controller transmits the chip address to the semiconductor memory chip, only when the number of fail bits of a single one of the semiconductor memory chips is between the first reference value and the second reference value.

9. The device of claim 8, wherein when a plural number of fail bits of plurality of the semiconductor memory chips are between the first reference value and the second reference value, the memory controller does not transmit the chip address to the semiconductor memory chips, changes a position where the number of fail bits is measured in the semiconductor memory chips, and allocates the chip address to the semiconductor memory chip that has not received the chip address, depending on changed number of fail bits.

10. A method for setting chip addresses for a semiconductor memory device comprising a plurality of semiconductor memory chips stacked, each semiconductor memory chip comprising a fail bit counter configured to count a number of fail bits of memory cells in the semiconductor memory chip itself, and a chip-address setting part configured to determine a chip address of the semiconductor memory chip, the method comprising:
   writing a specified data to the plurality of semiconductor memory chips;
   performing a verify read operation to the plurality of semiconductor memory chips;
   counting a number of fail bits of the memory cells in each semiconductor memory chip; and allocating respectively different ones of the chip addresses to the semiconductor memory chips, depending on the number of fail bits.

11. The method of claim 10, wherein
the chip-address setting part compares first and second reference values received from outside of the semiconductor memory chip to the number of fail bits; and
the chip address is allocated to one of the semiconductor memory chips, when the number of fail bits of the semiconductor memory chip itself is between the first reference value and the second reference value.

12. The method of claim 10, wherein
the semiconductor memory chip, to which a chip address has been allocated, becomes inaccessible during the allocating operation of the chip addresses.

13. The method of claim 11, wherein
the semiconductor memory chip, to which a chip address has been allocated, becomes inaccessible during the allocating operation of the chip addresses.

14. The method of claim 10, wherein
the semiconductor memory chip, to which a chip address is not allocated during the allocating operation of the chip addresses, becomes inaccessible as a fail chip, during a normal operation.

15. The method of claim 11, wherein
the semiconductor memory chip, to which a chip address is not allocated during the allocating operation of the chip addresses, becomes inaccessible as a fail chip, during a normal operation.

16. The method of claim 12, wherein
the semiconductor memory chip, to which a chip address is not allocated during the allocating operation of the chip addresses, becomes inaccessible as a fail chip, during a normal operation.

* * * * *